March 10, 1970 C. C. ALLEN 3,500,428

MICROWAVE HYBRID MICROELECTRONIC CIRCUIT MODULE

Filed Aug. 30, 1967 4 Sheets-Sheet 1

Inventor:
Charles C. Allen,
by Donald R. Campbell
His Attorney.

March 10, 1970 C. C. ALLEN 3,500,428

MICROWAVE HYBRID MICROELECTRONIC CIRCUIT MODULE

Filed Aug. 30, 1967 4 Sheets-Sheet 2

Inventor:
Charles C. Allen,
by Donald R. Campbell
His Attorney.

Inventor:
Charles C. Allen,
by Donald R. Campbell
His Attorney.

March 10, 1970 C. C. ALLEN 3,500,428

MICROWAVE HYBRID MICROELECTRONIC CIRCUIT MODULE

Filed Aug. 30, 1967 4 Sheets-Sheet 4

Inventor:
Charles C. Allen,
by Donald R. Campbell
His Attorney.

United States Patent Office 3,500,428
Patented Mar. 10, 1970

3,500,428

MICROWAVE HYBRID MICROELECTRONIC CIRCUIT MODULE

Charles C. Allen, Schenectady, N.Y., assignor to General Electric Company, a corporation of New York Filed Aug. 30, 1967, Ser. No. 664,348
Int. Cl. H01q *3/26;* H01p *3/08;* H05k *1/16*
U.S. Cl. 343—854 8 Claims

ABSTRACT OF THE DISCLOSURE

A microwave hydrid microelectronic circuit module comprises a ceramic substrate having a plurality of through holes in which circuit device chips or other circuit elements are bonded so that the upper surface of the circuit chips or elements and of the bonding material such as epoxy are flush with the top surface of the substrate. Strip transmission lines are deposited onto the top of the substrate extending across the bonding material onto terminal areas on the chip or to the top of the circuit element, and the bottom of the substrate has a continuous ground plane. Microwave input-output connections or through-pins are mounted in the substrate by the same bond-and-print technique.

This invention relates to microelectronic circuit modules, and more particularly to hybrid microelectronic modules for microwave applications.

The electronic circuits of certain microwave equipment present opportunities for the use of microelectronics for the standard reasons of achieving reduced weight, reduced volume, and reduced cost. Packaging of the circuits in the form of microelectronic modules is most feasible and advantageous, of course, in those areas where a standard circuit or construction is repeated many times in order to obtain the higher volumes needed to make the manufacture of microelectronic modules economical. One such application in the field of microwaves which utilizes a large number of standardized circuits is the transmit-receive circuits for a phased array antenna system. A phased array antenna uses a great number of antenna elements each having an associated transmit-receive circuit which are identical except that the phasing of the elements varies from one section of the antenna system to the next. In considering the design of a microelectronic module suitable for microwave frequency applications, it is necessary at these frequencies to employ transmission lines having controlled impedance, and special attention must be given to substrate capacitances. Although a monolithic silicon integrated circuit module has been suggested, the active devices incorporated into the module circuitry must necessarily be silicon devices, and furthermore the circuit size is limited by the available sizes of pure silicon substrate and the processing equipment. The desirability of the larger module is that more circuits can be included with a subsequent reduction in the number of interconnections and increase in reliability.

Accordingly, an object of the invention is to provide a new and improved hybrid microelectronic module for microwave circuit applications suitable to incorporate a variety of active devices and other circuit elements or sub-circuits and through-pin connections, and to employ transmission line printed wiring for the interconnections between these circuit devices, and which can be made in a variety of sizes including the larger sizes for packaging several standard unit circuits.

Another object is to provide a new and improved method for fabricating these microwave hybrid microelectronic modules.

Yet another object of the invention is the provision of such a new and improved hydrid microelectronic module especially suitable for the microwave circuits of a phased array antenna system, and which incorporate by a similar construction the interface between the radiating elements and the transmit-receive circuits.

In accordance with the invention, the hybrid microelectronic module for microwave circuits comprises a thin planar ceramic substrate having a plurality of holes at predetermined locations and a thin metallic coating on its bottom surface for providing a ground plane. A plurality of solid state circuit device chips containing an active element or sub-circuit or the like are each mounted in one of the holes with the upper planar surface of the chip flush with the top surface of the substrate, and bonding material is deposited to completely fill the space between the periphery of each chip and the wall of the surrounding hole in such manner that the surface of the bonding material is substantially flush with the surfaces of the substrate and chip. Strip transmission lines comprise a metallic substance deposited on the top surface of the substrate in predetermined printed wiring patterns so that the lines extend across the bonding material onto and in alignment with the terminal areas on the circuit device chips to make connection therewith. As an additional feature of the invention, microwave input-output connections having a similar construction comprise two through-pins bonded into two holes in a similar manner and interconnected with each other and at least one of the circuit device chips by a strip transmission line deposited on the upper surfaces of the pins. Other circuit elements can be included in the module in like manner.

In fabricating the module, a flat mandrel plate coated with a release agent is employed, and the space between the chip and the surrounding wall of the hole is filled with a heat curable bonding agent which has a liquid phase during curing. After hardening the bonding material, the mandrel plate is stripped off and the strip transmission lines deposited by thin film or possibly thick film techniques.

The foregoing and other objects, features, and advantages of the invention will be more apparent from the following more particular description of the preferred embodiments of the invention as illustrated in the accompanying drawings wherein.

Figure 1:
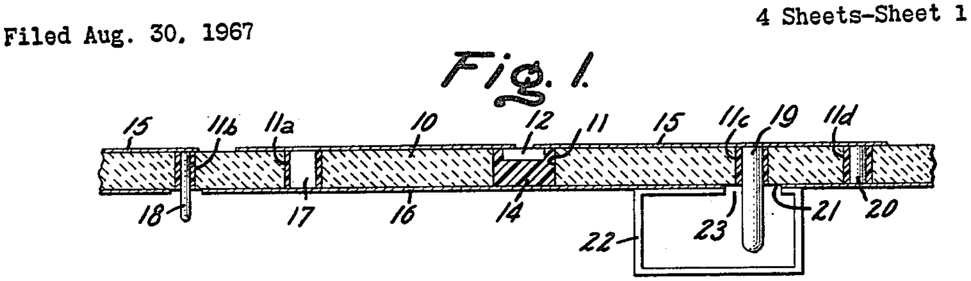
FIG. 1 is a partial vertical section through a microwave hybrid microelectronic circuit module illustrating several features of the invention including the mounting of a solid state circuit device chip, a microwave input-output connection made by a similar method, and the inclusion of other circuit elements such as ferrite by a similar construction.

Referring to FIG. 1, the hybrid microelectronic circuit module for microwave circuits comprises a thin planar insulating substrate 10 having a plurality of holes 11 to 11$d$ at predetermined locations which extend through the substrate from the top surface to the bottom surface. The substrate 10 is preferably made of a ceramic material and is ordinarily square or rectangular in shape. In each of the holes is bonded a circuit element such as a solid state circuit device chip containing a single device or a sub-circuit or complete circuit, some other circuit element such as ferrite or other special material, and through-pins for making input or output connections to the microwave circuit packaged in the module. The hole 11 is square (see also FIG. 2) and contains a solid state circuit device chip 12 such as a silicon diode chip or silicon transistor chip. The circuit device chip 12 has a thickness considerably less than the thickness of the substrate 10 and has a planar upper surface containing a plurality of terminal areas 13 which connect to the solid state device or devices formed in the chip. The chip 12 is mounted in the hole 11 by means of bonding material 14 in such manner that the upper surface of the chip 12 is flush with the substrate. The bonding material or bonding agent 14 completely or substantially completely fills the space between the periphery of each of the circuit device chips 12 and the surrounding wall of the hole 11 in which it is mounted, and the upper surface of the bonding material 14 is furthermore substantially flush with the surface of the substrate 10 and the chip 12.

Figure 2:
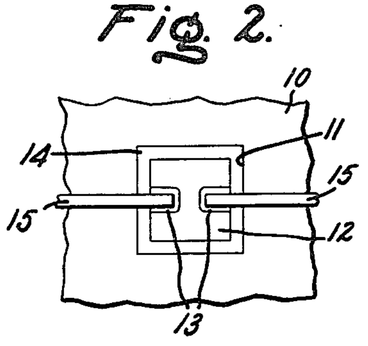
FIG. 2 is a partial plan view of the upper surface of a module showing the bonding of a circuit device chip into a hole in the substrate.

The various circuit elements mounted in the substrate 10 are interconnected in a predetermined printed wiring pattern by means of strip transmission lines 15 comprising a thin layer of a metallic substance deposited on the upper surface of the substrate. The strip transmission lines 15 have a carefully controlled width and thickness in order that they have a desired characteristic impedance. The lines 15 may, for example, be deposited initially by a thin film vaporization process and subsequently increased in thickness to about 0.2 mil, be 20 mils wide, and have a characteristic impedance of about 50 ohms. Strip transmission lines produced by a thin film process are desirable for the higher microwave frequencies in the X-band or thereabouts to achieve the required dimensional tolerances; however, for lower microwave frequencies it would be possible to use one of the known thick film processes, and in either case the thickness of the strip transmission lines can be built up by electroless deposition if desired. As best shown in FIG. 2, the strip transmission lines 15 cross over the upper surface of the bonding material 14 onto and in alignment with the terminal areas 13 of the circuit device chip 12 to make connection therewith. The bottom surface of substrate 10 has a thin metallic coating 16 deposited over the entire surface for providing a ground plane.

As has been mentioned, other circuit elements can be provided in the module by a similar bond-and-print construction. For example, a plug of ferrite material 17 is bonded within the hole 11$a$ in the substrate 10, and printed wiring strip transmission lines 15 are deposited over the flush mounted upper surface of the ferrite material. Input and output connections for the D-C leads and for intermediate frequency terminals can be provided by means of a pin 18 which is bonded within the round hole 11$b$ in the substrate and passes through a concentric clearance hole in the ground plane 16. The pin 18 is connected to other portions of the microwave circuit by means of control circuits comprising chokes and capacitors connected to the strip transmission line 15, which is deposited on the substrate and extends across the bonding material onto the upper flush surface of the pin. Input and output connections to the module at microwave frequencies require a different type of connector as shown at the right-hand side of FIG. 1. For the microwave connection, a pair of through holes 11$c$ and 11$d$ are provided in the substrate 10 and are spaced apart approximately one-quarter wavelength at the selected microwave frequency. An elongated conductive pin or probe 19 is bonded in the hole 11$c$, while another conductive pin 20 is bonded in the hole 11$d$ (both holes are round) and extends only from the top surface of the substrate to the bottom surface. The two conductive pins 19 and 20 are interconnected by a deposited strip transmission line 15 which interconnects the flush upper ends of the two pins and also makes connection to at least one of the circuit device chips 12 or other circuit elements. The ground plane metallic coating 16 has a circular non-conductive area 21 about the pin 19 so that this pin does not make connection to the ground plane. The ground plane 16 does, however, extend over and make connection to the pin 20, and in the same manner it makes connection to the ferrite material 17. If desired, additional pins 20 can be mounted in a circular arc about pin 19 to constrain the electromagnetic fields at the right angle transition and thus suppress radiation.

One use of the microwave input-output connection comprising the interconnected pins 19 and 20 is to couple a microwave transmit-receive circuit to a radiating element. The radiating element is for instance a resonant slot in a rectangular waveguide 22 defining a waveguide cavity which is excited by the probe 19 from the microelectronic strip line circuit 15. The probe 19 for this purpose extends into the waveguide through an aperture 23 in its upper wall. Because of the spacing of the two pins 19 and 20 one-quarter wavelength apart, the electrical short provided by pin 20 presents an electrical open circuit from the strip transmission line 15 across the probe 19 to effect efficient transmission of microwave power to or from the probe 19. As will be illustrated later, the microwave input-output connection can also be employed at the other end of the microwave transmit-receive circuit to make connection to a power divider or a local oscillator source.

Figure 3:
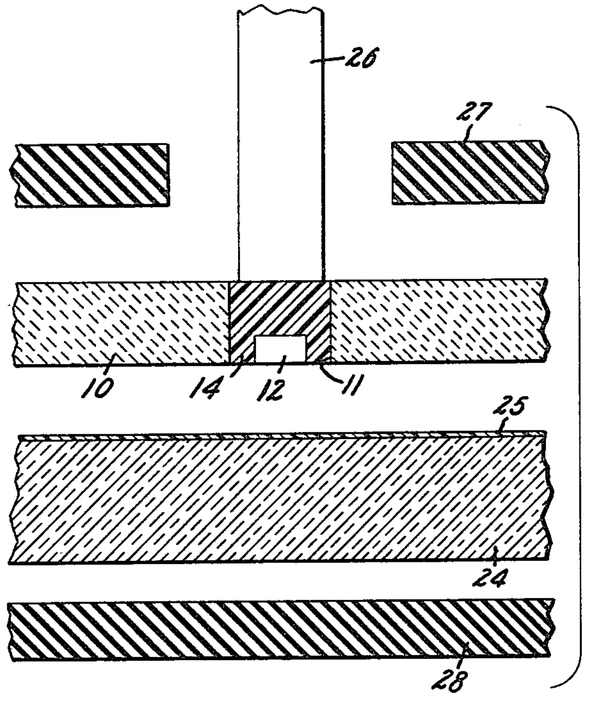
FIG. 3 is an expanded side view of an assembly of component parts and work fixtures employed in fabricating the hybrid microelectronic module.

FIG. 3 illustrates some of the steps involved in bonding a circuit element such as the circuit device chip 12 within a hole in the substrate 10. A suitable bonding agent or bonding material 14 for filling the space between the periphery of the chip 12 and the surrounding wall of the hole 11 is an epoxy adhesive and it has been found that a fluid bed epoxy powder gives good results. A suitable fluidized epoxy powder which can be used is identified as Minnesota Mining and Manufacturing No. 105 Fluid Bed Powder. It has a cure temperature of 190–200° C. and goes through a liquid phase before being cured and cooled to a solid. While in the liquid state, the fluidized bed epoxy forms an excellent bond to most metals and ceramics, and consequently some type of an epoxy release or mold release is necessary.

In performing the method, the top surface of the substrate 10 is placed face down against the coated surface of a flat mandrel plate 24 having an adhered coating of a release agent 25 such as Teflon (trademark of the Du Pont Company) or silicone. The circuit device chip 12 is then inserted face down into the hole 11 in the proper orientation. The fluid bed epoxy powder providing the bonding agent 14 is packed into the space surrounding the chip 12 and the rear of the hole using a ramrod 26. By packing the epoxy powder down tight, the spaces around the circuit device chip 12 are completely filled, and a peripheral space of as little as 3 to 4 mils can be packed by this method. Tightly packed epoxy powder means that there is less air in the packed powder and fewer bubbles in the cured material, and promotes uniform bonding of the surfaces of the substrate 10 and chip 12 with the epoxy. If the epoxy powder is loosely packed, the surface tension of the liquid pulls all the epoxy liquid to the areas of initial liquefaction and may result in a finished molule in which the hardened surface of the bonding material 14 is not flush with the upper surfaces of the substrate 10 and chip 12. During the heating of the epoxy powder 14 to cure it, a retaining material not shown may be placed at the rear of the packed hole 11 to retain the powder in place. Before clamping together the substrate 10 and mandrel plate 24, a pair of silicone rubber pads 27 and 28 are placed on either side of the assembly because the silicone rubber expands during heating and provides a tighter clamp.

A suitable ceramic material for the substrate 10 is a dense alumina having fine grain boundaries. The top surface of the flat mandrel plate 24 should be smooth since in passing through the liquid stage while curing, the bonding material 14 will reproduce any surface defects, holes, pits, or unevenness. A glass plate has the advantage of being optically smooth, while a mandrel plate which is made of molybdenum has the advantages of a low coefficient of thermal contraction and extremely rapid heat transfer. In the place of the through holes 11 in the substrate 10, the circuit element could be bonded in a recess or shallow hole in the substrate, however, the results are not as desirable. It will be further appreciated that other bonding materials can be used in place of the preferred fluid bed epoxy powder. In some stage of the processing, the bonding material must go through a liquid state to form a smooth flush continuous surface between the surface of the substrate 10 and the circuit device chip 12. Furthermore, the bonding agent must be able to withstand a brief processing temperature which may be above its curing temperature during the deposition of the strip transmission lines 15 onto the upper flush surfaces of the substrate, bonding material and circuit device chip or other circuit element. When aluminum is vaporized onto the surface of the module in a printed wiring pattern, a brief processing temperature of about 250° C. is needed to react the aluminum and the silicon of the chip 12 to form a good electrical bond connection. Obviously, the material for the bonding agent and the deposited metallic wiring lines are chosen so that there is a good bond between them. Because of the comparatively low temperatures involved as compared to monolithic processing, considerable freedom is given in the choice of materials.

Figure 4:
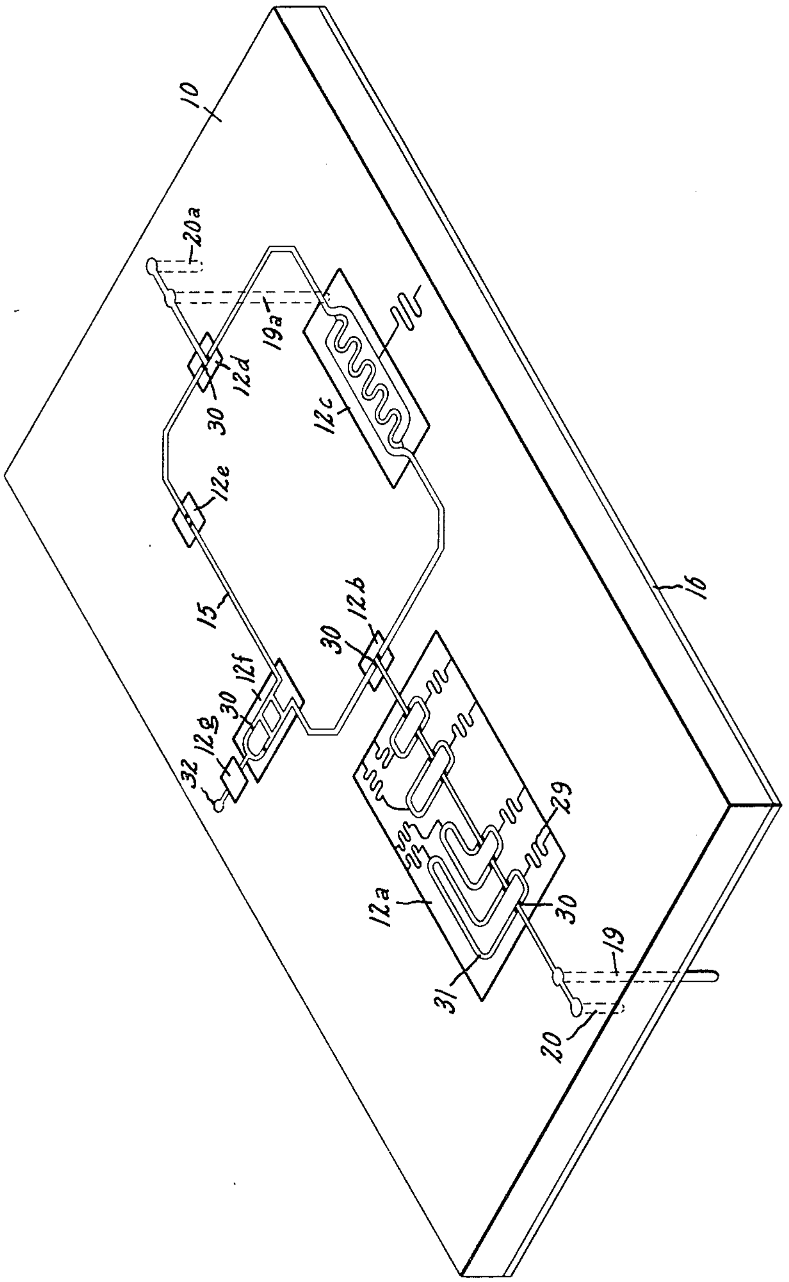
FIG. 4 is a perspective view of a microwave hybrid module which packages a single standard transmit-receive circuit.

A new and improved microwave hybrid microelectronic circuit module constructed in accordance with the foregoing bond-and-print technique is shown in FIG. 4. This module packages a standard transmit-receive circuit for one element of an antenna array, and by way of example of the size is about 0.6 inch by 1.2 inches. The module contains a plurality of circuit device chips 12*a* through 12*g* which, as will be explained, contain pairs of diodes or a sub-circuit such as an amplifier or phase shifter. The various circuit device chips are interconnected by the strip transmission lines 15 having a selected characteristic impedance, an at one end of the circuit is a microwave input-output connection comprising the pins 19 and 20 which can be connected to a microwave power source or a local oscillator source, while at the other end of the circuit is another input-output connection comprising the pins 19*a* and 20*a* which is adapted to be coupled to a radiating element as previously described.

During the transmit interval, the transmit pulse is applied to the input pin 19 and is given the desired phase shift by a phase shift circuit on the chip 12*a*. This phase shift circuit is a four-bit digital phase shifter which is switched by logic circuits (not here shown) that operate through chokes 29 for the D-C control signals. The D-C control signals bias a plurality of diodes, four diodes per bit position, which direct the input transmit pulse through the reference channels or one or more of four switched line lengths 31. The shortest of the switched line lengths 31 gives a 22.5° phase shift while the others have successively double the phase shift to a maximum of 180°. On the chip 12*b* is a transmit-receive switch comprising a pair of diodes 30. During the transmit interval the transmit pulse is directed to a transistor or other suitable transmit amplifier on chip 12*c* and then to another TR switch on chip 12*d* for directing the transmit pulse to the probe pin 19*a* which couples the signal to the radiating element. During the receive interval, the pulse received at the probe pin 19*a* is directed by the TR switch on the chip 12*d* to a tunnel diode preamplifier on the chip 12*e*, and then to a hybrid balanced mixer circuit on the chip 12*f* acting in conjunction with two diodes 30. The output of the mixer circuit is the intermediate frequency signal which passes through a preamplifier on the chip 12*g* before being available at the IF output pin 32. During the receive interval, the local oscillator signal is applied to the pin 19 and through the phase shift circuit on chip 12*a* and the TR switch on chip 12*b* to the balanced mixer circuit. A ferrite circulator could be used alternatively to the TR switch on chip 12*d*.

Figure 5:
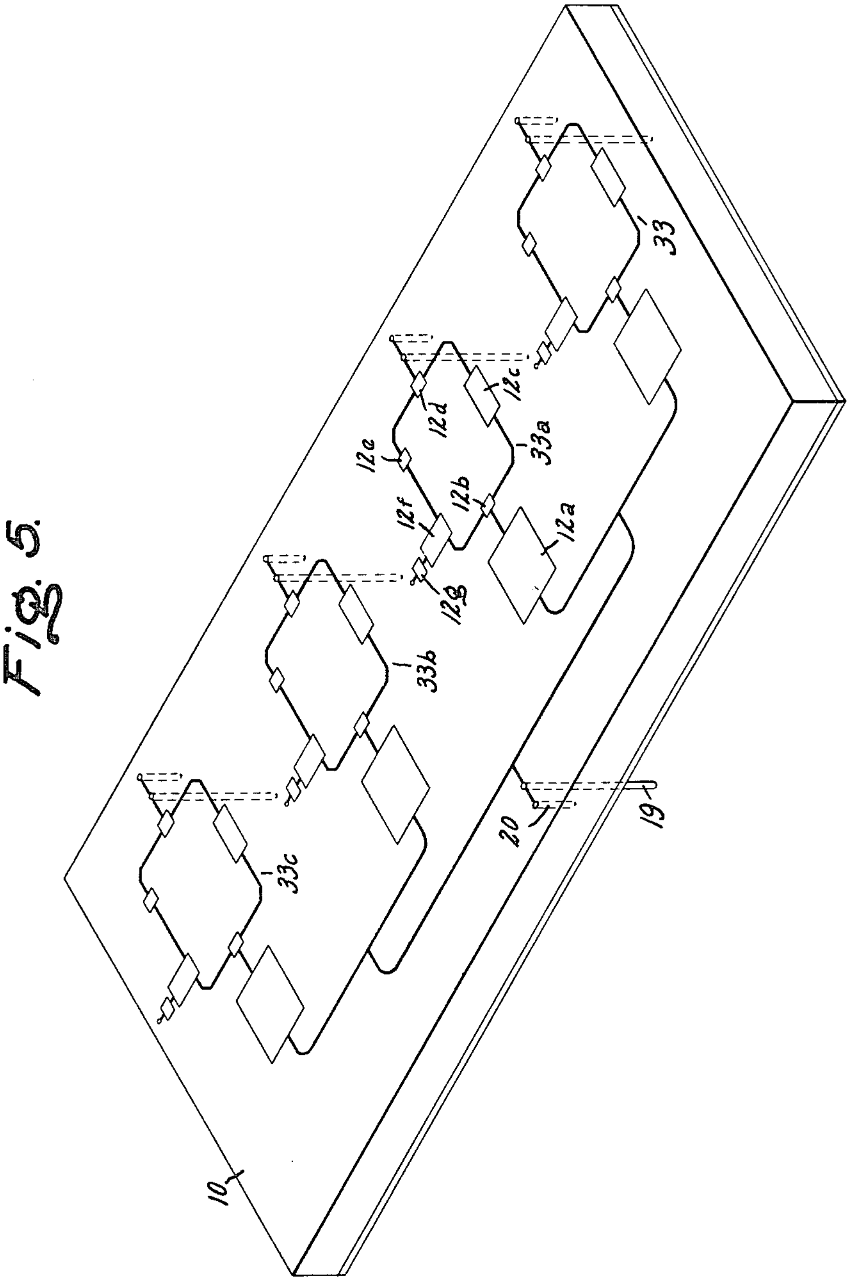
FIG. 5 is a perspective view of a microwave hybrid subarray module having four of the standard circuits shown in FIG. 4.

FIG. 5 shows a larger sub-array module containing four of the standard transmit-receive circuits 33 to 33*c*, each of which is identical to the standard circuit shown in larger scale in FIG. 4. With this arrangement, only the one microwave input-output connection comprising the pins 19 and 20 need be used, since the pin 19 is connected in parallel to the phase shift circuits in each of the transmit-receive circuits 33 to 33*c*. The principal advantage of using more than one circuit per module is the reduction in the number of interconnections and thus an increase in reliability. The substrate 10 for this sub-array module has the size of about 1.5 inches by 2.5 inches. By using a larger substrate, a module of up to about 8 elements can be considered.

Figure 6:
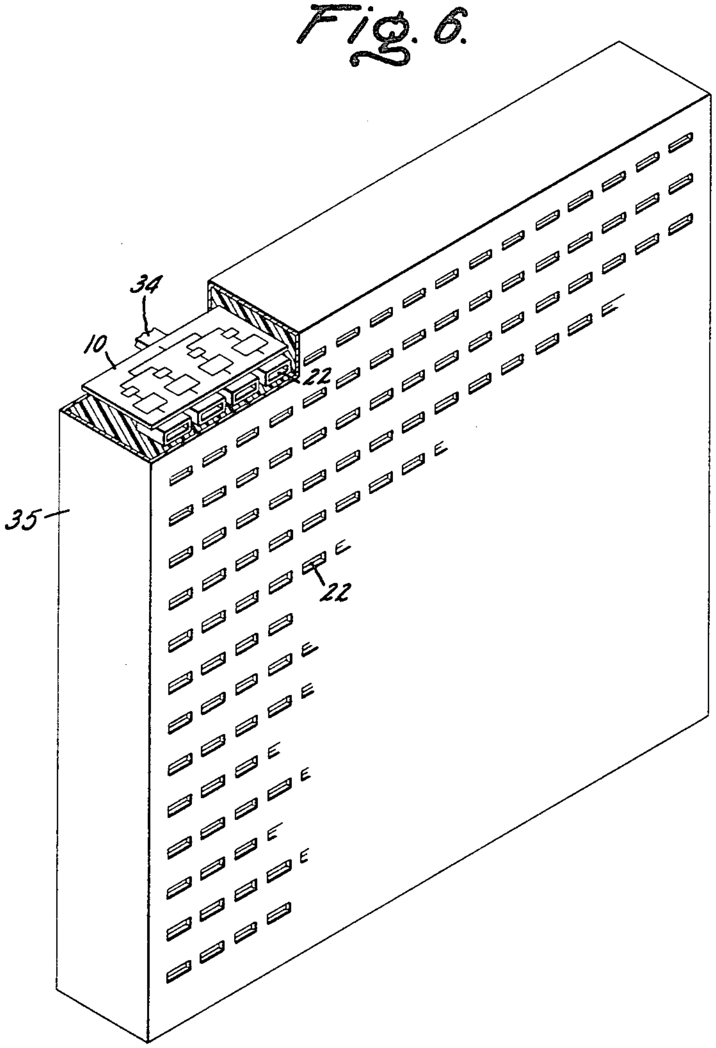
FIG. 6 is a perspective view illustrating the arrangement of a phased array antenna of microwave hybrid subarray modules of the type shown in FIG. 5.

FIG. 6 shows a complete phased array antenna system made up of a plurality of the sub-array modules of the type shown in FIG. 5, and the four identical transmit-receive circuits each connected to a radiating element 22 are identifiable. The waveguide 34 (shown broken off) forms a part of the corporate power divider network, and the entire group of sub-array modules are assembled in a case 35. For some applications, a shielded strip transmission line power divider can be used instead of a waveguide.

By constructing and fabricating the hybrid microwave module in accordance with the teachings of the invention, the size of the module is limited only by the size of the ceramic substrate and the circuit processing equipment. By making the circuit device chips or other circuit elements separately, the advantage of monolithic integrated circuit construction can be achieved without the problems associated with the use of a pure silicon substrate. While individual solid state devices can be assembled in the ceramic substrate by the bond-and-print technique, it is more likely that major system building blocks or sub-circuits, such as the receiver, transmitter, and the phase shifter circuits, would be assembled by this method. This would give flexibility to the system design, allow the basic circuit to be constructed of various materials in the manner best suited to their function, and permit preliminary testing of the major components before assembly. The bond-and-print technique is an effective, a versatile, and practical alternative to conventional hybrid circuit constructions which use gold leads to make connection to the chip or in which the chip is inverted for bonding to the substrate. The bond-and-print technique gives better control of the strip transmission line junction dimensions for impedance matching at microwave frequencies, and results in good strip transmission line dimensions and surface control.

While the invention has been particularly shown and described with reference to several preferred embodiments thereof, it will be understood by those skilled in the art that various changes in form and details may be made therein without departing from the spirit and scope of the invention.

What I claim as new and desire to secure by Letters Patent of the United States is:

1. A hybrid microelectronic circuit module for microwave circuits comprising a thin planar ceramic substrate having a top surface and a bottom surface and a plurality of holes at predetermined locations extending therethrough from one of the surfaces to the other, a plurality of solid state circuit device chips each having a planar upper surface and a plurality of terminal areas thereon connecting to the device, each such circuit device chip having a thickness dimension considerably less than that of the substrate and mounted in one of said holes with the upper surface of the chip flush with the top surface of the substrate, bonding material deposited to completely fill the space between the periphery of each of the circuit device chips and the wall of the hole in which it is mounted in such manner that the surface of the bonding material is substantially flush with the surfaces of said substrate and circuit device chips, strip transmission lines having a desired characteristic impedance comprising a thin layer of a metallic substance deposited on the top surface of said substrate in predetermined printed patterns and including portions which extend across the bonding material onto and in alignment with the terminal areas of said circuit device chips to make connection therewith, and a thin metallic coating deposited on the bottom surface of said substrate for providing a ground plane.

2. The construction set forth in claim 1 further including a microwave input-output connection for the module comprising at least two additional through holes in said substrate spaced one-quarter microwave wavelength apart, a conductive pin bonded to each of said additional holes in identical fashion as said circuit device chips so that the upper surfaces of said pins and bonding material are flush with the top surface of the substrate, and another strip transmission line deposited on and interconnecting the upper surfaces of said pins and connected to one of said circuit device chips, one of the conductive pins extending through the substrate to the bottom surface thereof to make connection to the ground plane while the other conductive pin extends beyond the bottom surface of the substrate through a concentric nonconductive clearance area in the ground plane so as not to make connection to the ground plane.

3. The construction set forth in claim 2 wherein the circuit device chips and strip transmission lines are connected together to form a standard transmit-receive circuit which is repeated several times, and each of said standard circuits are connected to an individual one of said microwave input-output connections which in turn are adapted to be coupled to individual radiating elements, said standard circuits also being connected at their other ends in parallel circuit relationship to an additional single one of said microwave input-output connections.

4. The construction as defined in claim 2 further including at least one additional circuit element bonded in another hole in the substrate in identical fashion as said circuit device chips so that the bonding material and circuit elements have flush upper surfaces on which a portion of the strip transmission lines are deposited.

5. The method of fabricating a microwave hybrid microelectronic circuit module comprising the steps of machining a plurality of holes at predetermined locations in a thin planar ceramic substrate, placing the top surface of said substrate face down against the coated surface of a flat mandrel plate having an adhered coating of a release agent, inserting face down into each of the holes a circuit device chip having a planar upper surface and a plurality of terminal areas thereon, completely filling the spaces between each of the circuit device chips and the surrounding walls of the holes with a heat curable bonding material and curing the bonding material, stripping off the flat mandrel plate, depositing a thin layer of metallic substance onto the upper surface of said substrate in a predetermined printed wiring pattern having portions which extend across the bonding material onto the terminal areas of the circuit devices to make connection therewith, and depositing a thin metallic coating onto the bottom surface of said substrate for providing a ground plane.

6. The method set forth in claim 5 wherein the bonding material is a fluid bed epoxy powder which passes through a liquid state during curing.

7. The method set forth in claim 5 wherein the layer of metallic substance deposited on the upper surface of said substrate in a predetermined printed wiring pattern is deposited by a thin film vaporization technique with controlled dimensions so that the printed wiring pattern has a selected characteristic impedance for use as strip transmission lines.

8. The method as defined in claim 5 wherein other circuit elements are bonded in additional holes in the ceramic substrate in identical fashion and at the same time as said circuit device chips and have flush upper surfaces on which a portion of the printed wiring pattern is deposited.

References Cited

UNITED STATES PATENTS 3,142,783 7/1964 Warren ------------ 317—101

HERMAN KARL SAALBACH, Primary Examiner

M. NUSSBAUM, Assistant Examiner

U.S. Cl. X.R.

317—101; 333—84, 97